(12) United States Patent
Phan et al.

(10) Patent No.: US 7,076,320 B1
(45) Date of Patent: Jul. 11, 2006

(54) SCATTEROMETRY MONITOR IN CLUSTER PROCESS TOOL ENVIRONMENT FOR ADVANCED PROCESS CONTROL (APC)

(75) Inventors: Khoi A. Phan, San Jose, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 152 days.

(21) Appl. No.: 10/838,827

(22) Filed: May 4, 2004

(51) Int. Cl.
*G06F 19/00* (2006.01)

(52) U.S. Cl. .......................... 700/121; 700/95; 700/96; 700/108; 700/109; 700/110; 700/120; 702/33; 702/35; 702/40; 702/155; 702/168; 702/182; 356/611; 356/394; 356/625; 356/636; 438/795

(58) Field of Classification Search ............... 700/95, 700/96, 108, 109, 110, 120–121; 702/33, 702/35, 40, 155, 167–168, 182; 356/601, 356/394, 625, 636; 438/795
See application file for complete search history.

(56) References Cited

U.S. PATENT DOCUMENTS

| | | | |
|---|---|---|---|
| 5,841,180 A | 11/1998 | Kobayashi et al. | |
| 5,940,175 A * | 8/1999 | Sun | 356/237.3 |
| 5,942,775 A | 8/1999 | Yiannoulos | |
| 5,955,654 A * | 9/1999 | Stover et al. | 73/1.89 |
| 6,232,626 B1 | 5/2001 | Rhodes | |
| 6,245,601 B1 | 6/2001 | Kobayashi et al. | |
| 6,370,632 B1 * | 4/2002 | Kikuta et al. | 711/205 |
| 6,424,565 B1 | 7/2002 | Brug et al. | |
| 6,649,950 B1 | 11/2003 | He et al. | |
| 6,724,474 B1 * | 4/2004 | Heo et al. | 356/237.4 |
| 6,791,680 B1 * | 9/2004 | Rosengaus et al. | 356/237.2 |
| 6,809,809 B1 * | 10/2004 | Kinney et al. | 356/237.5 |
| 6,819,426 B1 * | 11/2004 | Sezginer et al. | 356/401 |
| 6,829,559 B1 * | 12/2004 | Bultman et al. | 702/155 |
| 6,838,742 B1 | 1/2005 | Rhodes | |
| 6,839,275 B1 | 1/2005 | Van Brocklin et al. | |
| 6,842,259 B1 * | 1/2005 | Rosencwaig et al. | 356/601 |
| 6,870,183 B1 | 3/2005 | Tripsas | |
| 6,873,543 B1 | 3/2005 | Smith et al. | |
| 6,885,573 B1 | 4/2005 | Sharma et al. | |
| 6,900,488 B1 | 5/2005 | Lopatin | |
| 2003/0045131 A1 * | 3/2003 | Verbeke et al. | 438/795 |

* cited by examiner

*Primary Examiner*—Ramesh Patel
(74) *Attorney, Agent, or Firm*—Amin & Turocy, LLP

(57) ABSTRACT

Systems and methods that improve process control in semiconductor manufacturing are disclosed. According to an aspect of the invention, conditions in a cluster tool environment and/or a wafer therein can be monitored in-situ via, for example, a scatterometry system, to determine whether parameters associated with wafer production are within control limits. A cluster tool environment can include, for example, a lithography track, a stepper, a plasma etcher, a cleaning tool, a chemical bath, etc. If an out-of-control condition is detected, either associated with a tool in the cluster tool environment or with the wafer itself, compensatory measures can be taken to correct the out-of-control condition. The invention can further employ feedback/feedforward loop(s) to facilitate compensatory action in order to improve process control.

24 Claims, 12 Drawing Sheets

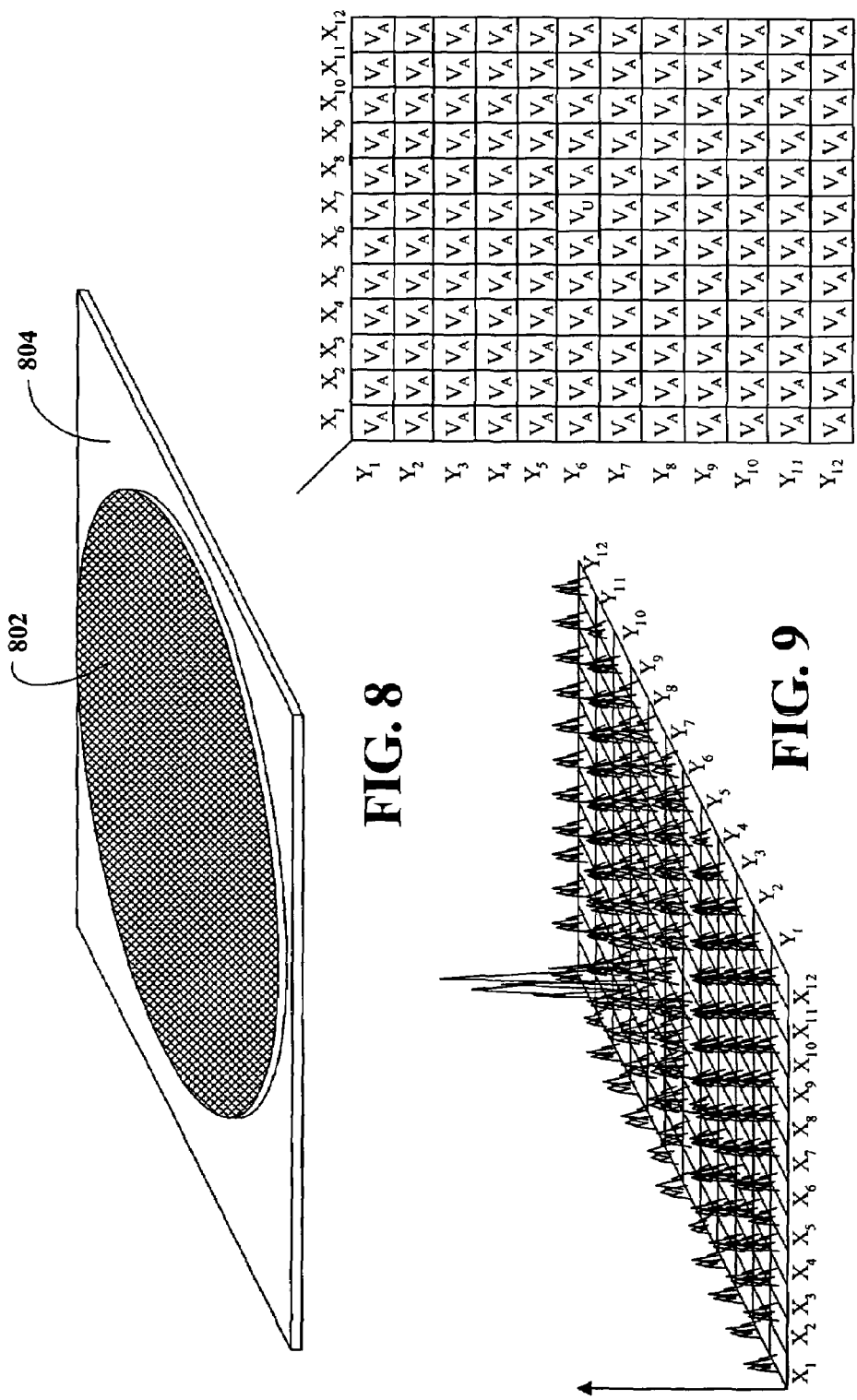

SCATTEROMETRY MONITOR IN CLUSTER PROCESS TOOL ENVIRONMENT FOR ADVANCED PROCESS CONTROL (APC)

TECHNICAL FIELD

The present invention relates generally to semiconductor fabrication, and more particularly, to systems and methods that improve process controls and efficiency in a wafer fabrication environment.

BACKGROUND OF THE INVENTION

In the semiconductor industry, there is a continuing trend toward higher device densities. To achieve these higher device densities there have been, and continue to be, efforts toward scaling down the device dimensions on semiconductor wafers. This continuing trend has also led to advanced monitoring and quality control of every step of the semiconductor manufacturing process.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as optical light, x-rays, or an electron beam) through an intervening master template, the mask, forming a particular pattern. Exposed areas of the coating become either more or less soluble than the unexposed areas (depending on the type of coating) in a particular solvent developer. The more soluble areas are removed with the developer in a developing step. The less soluble areas remain on the silicon wafer forming a patterned coating. The pattern corresponds to the image of the mask or its negative. The patterned resist is used in further processing of the silicon wafer.

Within lithography, patterns are transferred from a photomask or reticle onto a photoresist layer which overlies the film on the wafer through an exposure process. If the photomask or reticle contains defects, even submicron in range, such defects may be transferred to a wafer during the exposure. Such defects may be generated by the fabrication process utilized to produce the mask or reticle as well as during subsequent handling and processing. Such defects generally fall into two classes: fatal (or killer) defects and nonfatal defects.

Critical dimensions of the patterned resist, such as line widths, affect the performance of the finished product and are sensitive to processing conditions. Processing conditions that affect critical dimensions include conditions relating to resist application, pre-baking, resist exposure, post-baking, and resist development. A few degrees variation in the pre-bake temperature, for example, can have a significant affect on critical dimensions. Many of the conditions that affect critical dimensions are difficult to control, often resulting in variations from batch to batch.

The categories and examples of defects above are just a few examples of the possible fatal and nonfatal defects. In order to control the possible defects, track systems are used within the industry of lithography. Track systems overcome the limitations of conventional stand-alone systems used in resist application, pre-baking, resist exposure, post-baking, and resist development. Also, track systems allow for easy accessibility of all process modules, which reduces maintenance time, consistency of product and increase in productivity.

Techniques, equipment and monitoring systems have concentrated on preventing and reducing defects within the lithography process. For example, aspects of the resist process which are typically monitored are: whether the correct mask has been used; whether resist film qualities are acceptable (e.g., resist is free from contamination, scratches, bubbles, striations, etc.); whether image quality is adequate (e.g., good edge definition, linewidth uniformity, or indications of bridging); whether critical dimensions are within the specified tolerances; whether defect types and densities are recorded; and whether registration is within specified limits.

Within the lithography process, two automated areas of defect detection have been concentrated upon: electrical signal analysis and image analysis. By using an electrical signal analysis, defects such as "opens" in circuitry, unwanted electrical bridges, and electrical failures can be detected within the silicon wafers. Image analysis can consist of overlay inspection (OL) and critical dimension inspection (CD), which are used to determine the quality of the lithography process. The OL inspection measures the registration of consecutive layers of multi-layer semiconductor chips. During the inspection, the wafer is moved to an optical microscope. Under this optical microscope the position of marks or targets of the previous processed layer are measured against the marks of the layer that is currently being added. The CD inspection measures the layer linewidths. The wafer is moved to a high-resolution CD-SEM (Critical Dimension Scanning Electron Microscope) where the line-width is measured and determined to be within a threshold or pre-determined tolerance.

Detection of CD deviation is an important aspect of wafer fabrication. Often, a defect goes undetected until a wafer is completely manufactured, and is only discovered upon failure of the final product. Furthermore, transferring a wafer to an inspection tool after each individual process is inefficient and cost-prohibitive. An unsatisfied need exists in the art for systems and methods that facilitate inline, continuous, and centralized wafer inspection and/or correction.

SUMMARY OF THE INVENTION

The following presents a simplified summary of the invention in order to provide a basis understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention generally relates to systems and methods that improve process control by providing an in-situ monitor that employs feedback/feed-forward loop(s) to more effectively enhance advanced process control (APC). Optical scatterometry (OCD), for example, offers many advantages in semiconductor processing, such as increased throughput, relatively low cost, and three-dimensional spatial information (e.g., thickness, critical dimension, profile, etc.). As a result, scatterometry plays a major role in APC in wafer fabrication systems.

According to an aspect of the present invention, a scatterometry component can be employed as an in-situ monitor utilizing feedback/feed-forward systems for APC. For example, OCD can be utilized to monitor parameters associated with track equipment in a cluster tool environment, such as hot plate temperature, resist and/or developer temperature, resist thickness, blank defect(s), etc. When a parameter is out of a control limit, the APC system can trigger a track controller to initiate adjustments to compensate for the parameter and to bring the parameter back within the control limit (e.g., change set temperature, adjust exhaust rate, adjust spin velocity to effect a change in resist thickness, etc.).

According to another aspect of the invention, OCD can be employed as an in-situ monitor for a stepper system in a cluster tool environment. For example, if a parameter of the stepper process is determined to be outside of a predetermined tolerance, the APC system can initiate compensatory adjustments to mitigate the effects of the out-of-control parameter. According to this aspect, an OCD component can be employed to determine whether, for example, whether an exposure period is of a proper duration, whether an exposure source is properly focused, etc. Based on such information, the APC system can initiate a feedback/feed-forward loop to correct any deviant parameters of the stepper system, and, thereby, improve wafer throughput, reduce wafer fabrication costs, etc.

According to yet another aspect of the invention, a plasma etch system in a cluster tool environment can be monitored in-situ by an OCD component. For example, OCD can monitor descum time, etch rate, profile, particle count, etc., and, upon an out-of-control occurrence in a monitored parameter, the APC system can initiate corrective action via a feedback/feed-forward loop.

Yet another aspect of the present invention provides for an OCD component that monitors in-situ a cleaning tool in a cluster tool environment. For example, the OCD component can monitor particle count, etch rate, etc., and provide information regarding parameters associated therewith to an APC system. The APC system can then initiate feedback/feed-forward loops to compensate for any out-of-control parameters that exist.

According to still another aspect of the present invention, an OCD component can monitor a chemical bath in-situ in a cluster tool environment to determine whether parameters associated therewith are within control tolerances. For example, the OCD component can monitor a concentration of polymers in the chemical bath. If a particular concentration is not within a control tolerance, an APC system can initiate corrective action such refill of the bath, change of a filter, substitution of a particular chemical, etc. In this manner, the present invention can improve process control, productivity, and performance of wafer fabrication systems.

According yet another aspect, an OCD component can initiate corrective action at a stage of wafer fabrication subsequent to the stage at which an out-of-control state is detected. For example, if the temperature of a hot plate in a track system is determined to be above a target tolerance, then the critical dimension(s) of the resist can be undesirably altered. The present invention can initiate compensatory action at a subsequent time, such as during exposure, so that the exposure time is adjusted to correct any deviation in CD caused by the out-of-control temperature of the hot plate. Additionally, the temperature of the hot plate can be corrected for subsequent wafers.

To the accomplishment of the foregoing and related ends, the invention then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed and the present invention is intended to include all such aspects and their equivalents. Other objects, advantages and novel features of the invention will become apparent from the following detailed description of the invention when considered in conjunction with the drawings.

BRIEF DESCRIPTION OF THE DRAWINGS

FIG. 8 illustrates a perspective view of a grid-mapped wafer according to one or more aspects of the present invention.

FIG. 9 illustrates plots of measurements taken at grid-mapped locations on a wafer in accordance with one or more aspects of the present invention.

FIG. 10 illustrates a table containing entries corresponding to measurements taken at respective grid-mapped locations on a wafer in accordance with one or more aspects of the present invention.

DETAILED DESCRIPTION OF THE INVENTION

Figure 1:
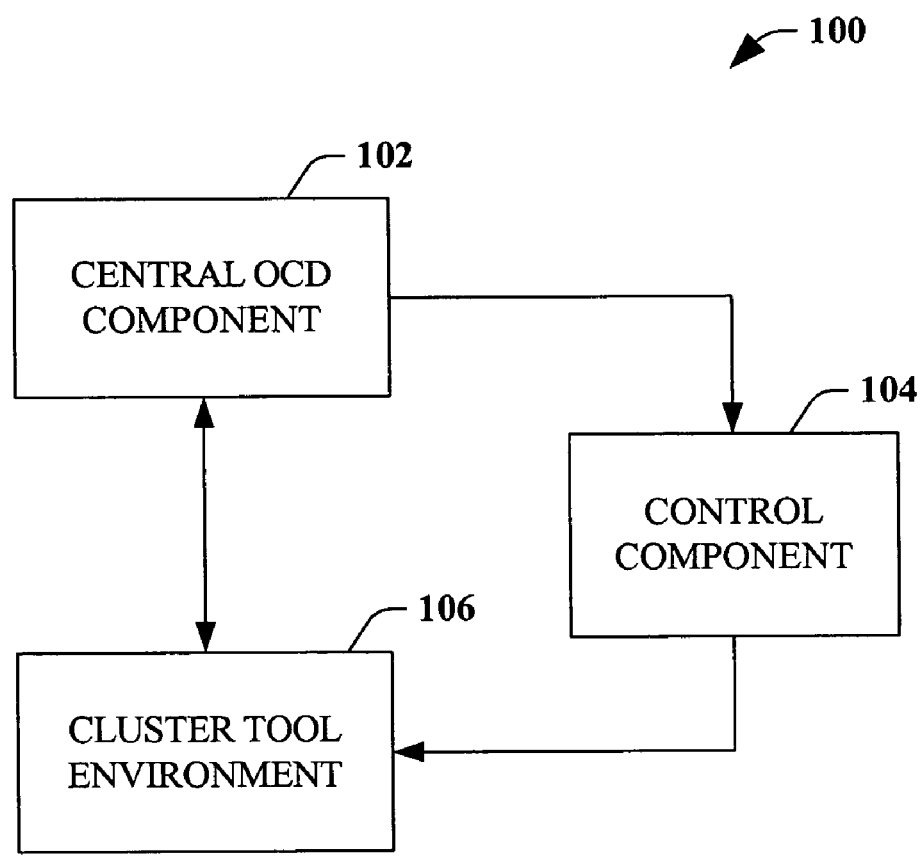
FIG. 1 is a block diagram of a system that improves control processes in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and a computer. By way of illustration, both an application running on a server and the server can be a component. One or more components may reside within a process and/or thread of execution and a component may be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as described herein. The present invention can employ various inference schemes and/or techniques in connection with the present invention. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

FIG. 1 is an illustration of a system 100 that improves process control via in-situ monitoring of a cluster tool environment and employing feedback/feed-forward loop systems. A central OCD component is operably coupled to a control component 104. The OCD component 102 and the control component 104 are both operably coupled to a cluster tool environment 106. The OCD component 102 can be, for example, a scatterometry component. Scatterometry is a technique for extracting information about a surface upon which an incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number, type of layers beneath the surface, refractive index of the surface, etc.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals, to determine whether the signals correspond to a stored signature. The present invention contemplates any suitable scatterometry component and/or system, and such systems are intended to fall within the scope of the hereto-appended claims.

It is further to be appreciated that information gathered by the OCD component 102 can be utilized for generating feedback and/or feed-forward data that can facilitate a determination of necessary corrective measures in the event of an out-of-control occurrence. The system 100 can additionally employ such data to control components and/or operating parameters associated therewith. For instance, feedback/feed-forward information can be generated from sequence analysis to maintain, increase and/or decrease a rate at which fabrication processes (e.g., exposure, plasma etch, cleaning, chemical bath, . . . ) progresses. For example, one or more threshold parameters can be altered to affect a control tolerance based on sequence analysis data.

It is to be understood that a that the control component 104 can be a processor dedicated to determining whether and to what extent a given parameter is out of control, a processor used to control one or more of the components of the APC system, or, alternatively, a processor that is both used to determine whether and to what extent a given parameter is out of control and to control one or more of the components of the APC system.

The cluster tool environment 106 can comprise, for example, a lithography track, a stepper, a plasma etcher, a cleaning tool, a chemical bath, etc. While the aforementioned tools are representative of components that can be monitored by the OCD component 102 and controlled by the control component 104, the present invention is not limited to a cluster tool environment comprising only such components. Rather, the cluster tool environment 106 can comprise any and all components and/or tools associated with lithographical processes and/or wafer manufacture, and all such tools and/or combinations thereof are intended to fall within the scope and spirit of the present invention.

Information gathered by the OCD component 102 indicative of an out-of-control condition can be analyzed by the control component 104. The control component 104 can initiate adjustments in the cluster tool environment to mitigate potential negative effects of the detected out-of-control occurrence. For example, if a temperature associated with a bake process deviates from a target temperature by 0.01 degrees, CD might be affected in a manner that results in a 0.02 nm divergence from a desired target CD. The control component can initiate corrective measures such as, for instance, adjusting the exposure period of a stepper, etc., so that target CD can still be achieved without having to discard the wafer. In this manner, the in-situ system 100 can improve wafer throughput and advance process control while reducing costs associated therewith.

Figure 2:
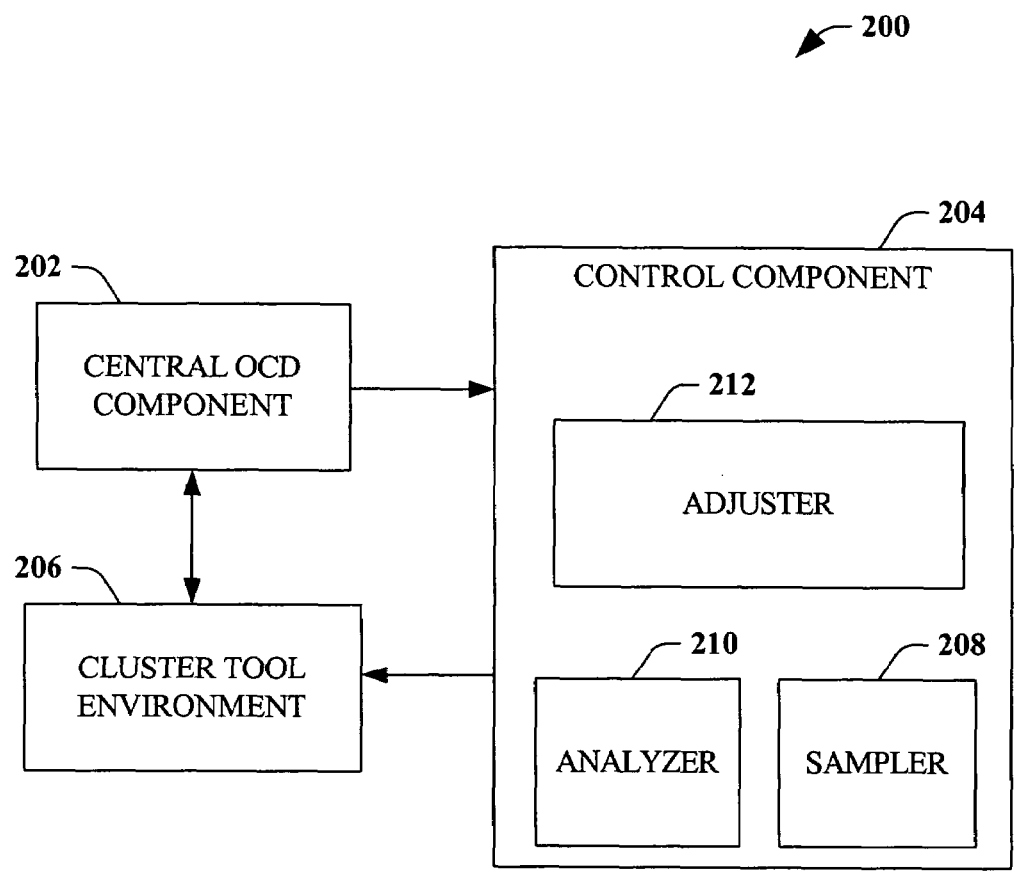
FIG. 2 is a block diagram of a system that improves control processes in accordance with an aspect of the present invention.

FIG. 2 is an illustration of a system 200 in accordance with an aspect of the invention. A central OCD component 202 is operably coupled to a control component 204 and a cluster tool environment 206. The control component to 204 is further operably coupled to the cluster tool environment 206. According to this aspect of the invention, the control component 204 has associated with it a sampler 208 that can take samples of data and/or parameters associated with the cluster tool environment. For example, the sampler 208 can receive data associated with hot plate temperature, stepper condition(s), chemical composition of a chemical bath, wafer layer thickness, etc. Such information can be relayed to an analyzer 210 associated with the control component. The analyzer 210 can determine whether a given set of sample data indicates that a parameter of the cluster tool environment 206 is within control limits or whether the parameter is out of control based on, for example, comparison with a predetermined set of parameter values. If sampled data indicates that a condition of the cluster tool environment 206 is in an out-of-control state, then an adjuster 212 that is operably coupled to the control component 204 can adjust parameters associated with the cluster tool environment 206 in order to compensate for and/or correct the out-of-control occurrence.

Figure 3:
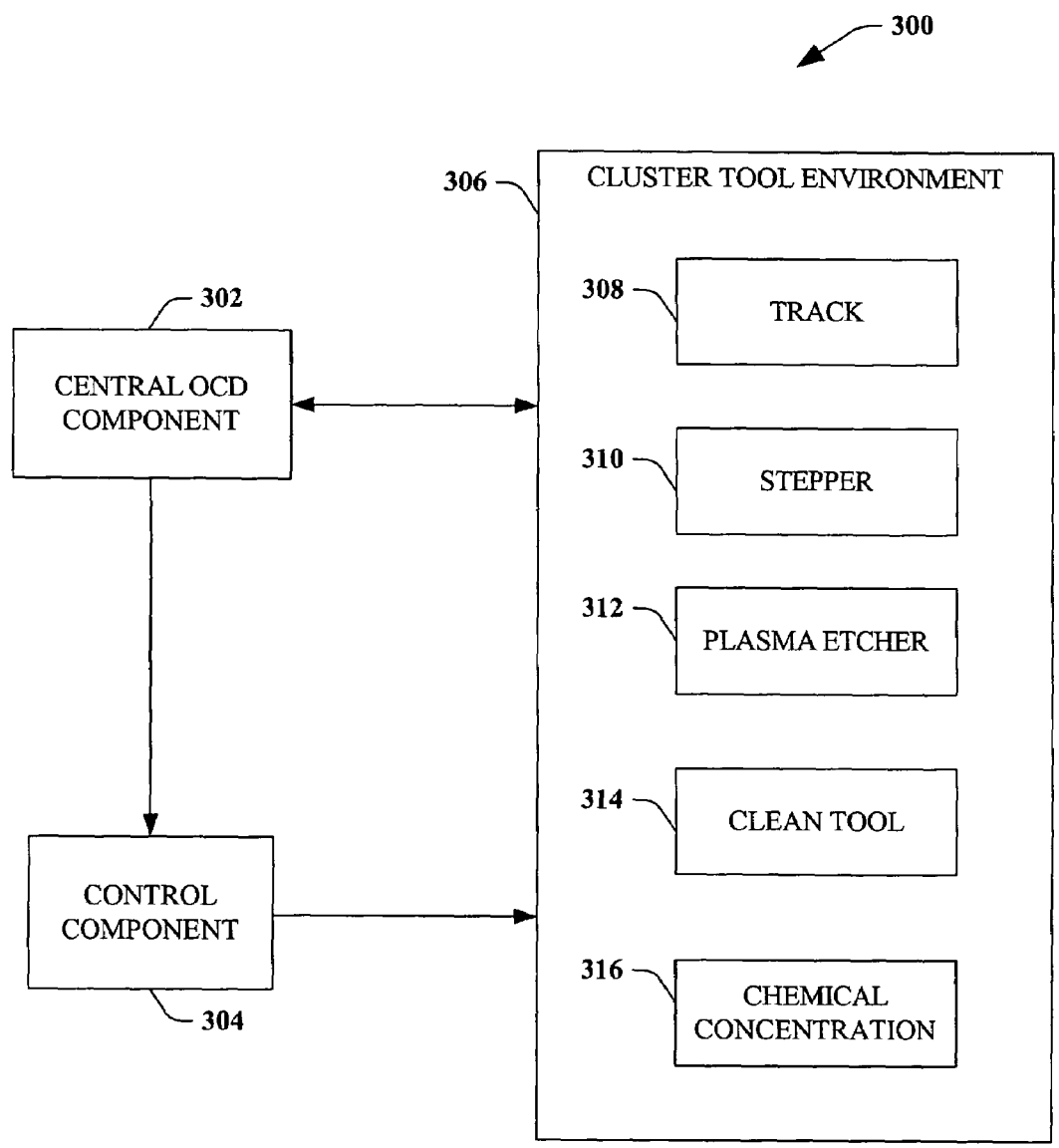
FIG. 3 is a block diagram of a system that improves control processes associated with a variety of lithographic tools in accordance with an aspect of the present invention.

FIG. 3 is an illustration of a system 300 that improves control processes according to an aspect of the present invention. A central OCD component 302 is operably coupled to a control component 304. Both the central OCD component 302 and the control component 304 are operably coupled to a cluster tool environment 306. The cluster tool environment 306 comprises a lithography track 308 and a stepper 310. The track 308 can monitored by the central OCD component 302 with regard to conditions such as, for example, temperature associated with a hot plate (e.g., post-exposure bake (PEB) temperature(s), temperature of a resist, developer, etc.), resist thickness, defect(s), etc. Monitored conditions can be fed back or forward to the control component 304, which can in turn initiated appropriate adjustment(s), if necessary, upon analysis of the information received from the central OCD component 302. In a similar manner, the central OCD component 302 can monitor the stepper 310 and provide information to the control component 304 regarding, for example, exposure of a wafer, focus of the exposure source, profile, thickness, etc. The cluster tool environment further comprises a plasma etcher 312, a cleaning tool 314, and a chemical bath 316. For example, the central OCD component 302 can monitor conditions associated with the plasma etcher 312, such as, for instance, critical dimension (CD), profile, in-situ descum, particle count (PC) test(s), etch rate, etc. With regard to the cleaning tool 314, PC and etch rate, for example, can be monitored. Conditions that can be monitored with respect to the chemical bath 316 comprise chemical concentration(s), chemical replenishment, filter condition (e.g., whether filter requires replacement, etc.), chemical change, etc., without being limited thereto.

It should be noted that the cluster tool components described above are given by way of example only, and are not presented in limiting sense. Rather, the cluster tool environment 306 of the present invention can comprise any and/or all components germane to the field of lithography and/or wafer production. Similarly, the aspects and/or conditions that can be monitored by the central OCD component 302 with respect to the above-described cluster tool components are exemplary and not intended to be limiting. It will be recognized that various other conditions and/or various other cluster tool components can be monitored and controlled by the present invention, and such other components and/or conditions are intended to fall within the scope of the here-to appended claims.

Figure 4:
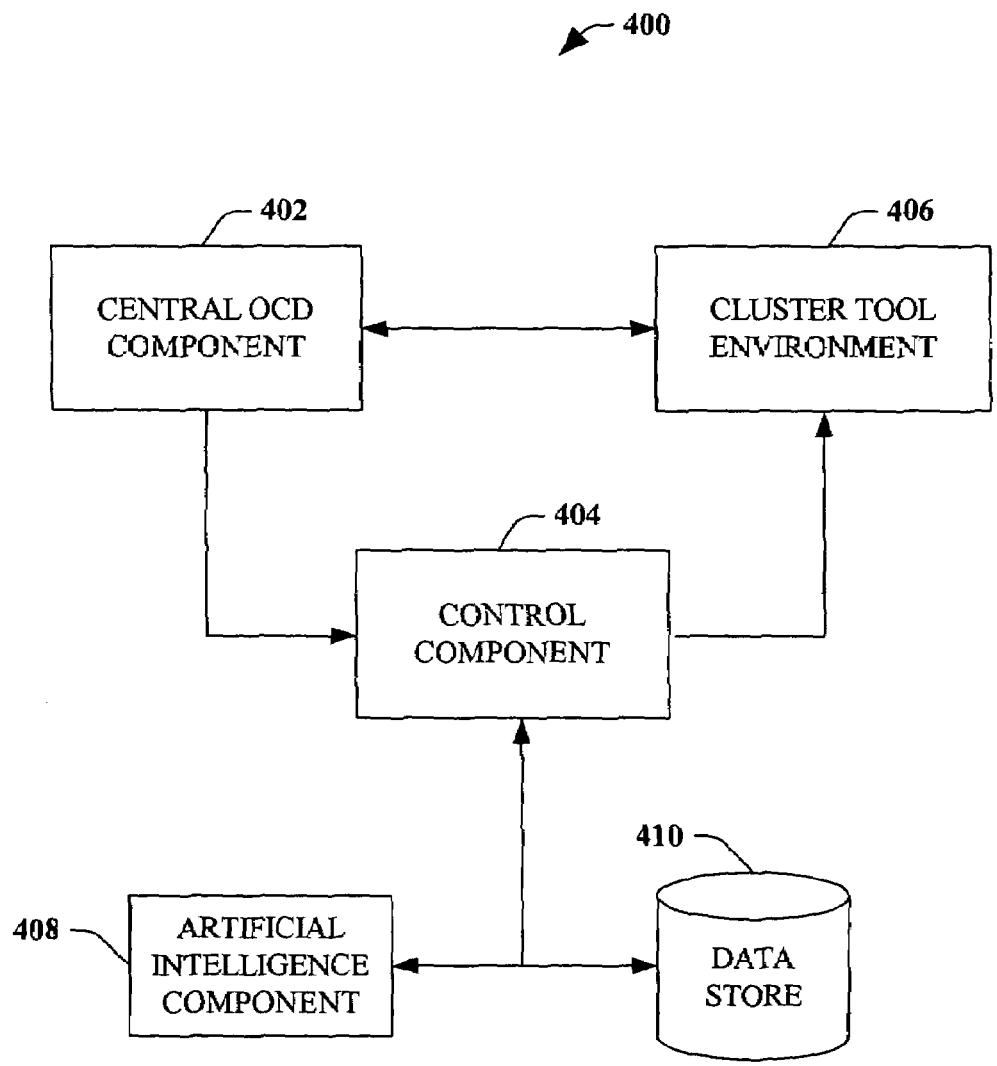
FIG. 4 is a block diagram of a system that improves control processes in accordance with an aspect of the present invention.

FIG. 4 is an illustration of a system 400 in accordance with an aspect of the present invention that has a memory and an artificial intelligence component operably coupled to a control component. The system 400 comprises a central OCD component 402 and a control component 404, operably coupled to each other and to a cluster tool environment 406. Further associated with the control component is an artificial intelligence (AI) component 408 that can make inferences regarding, for example, necessary adjustment of process(es) and/or tool parameters in the cluster tool environment. For instance, the AI component 408 can determine a most suitable adjustment to exposure time based on information analyzed by the control component 404. According to another example, the AI component 408 can infer whether a particular alteration in the chemical composition of a chemical bath will adequately compensate for an out-of-control condition that has been detected in the bath by the central OCD component 402. These examples are given by way of illustration only and are not in any way intended to limit the scope of the present invention or the number of, or manner in which the AI component makes, inferences.

A memory component 410 can be employed to retain information associated with, for example, monitored conditions in the cluster tool environment 406. The memory component 410, in conjunction with the control component 404, operates as a central database for all measurements, such that real-time compensatory action can be taken to permit increased throughput and decreased cost. Furthermore, the memory 410 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 410 of the present systems and methods is intended to comprise, without being limited to, these and any other suitable types of memory.

Figure 5:
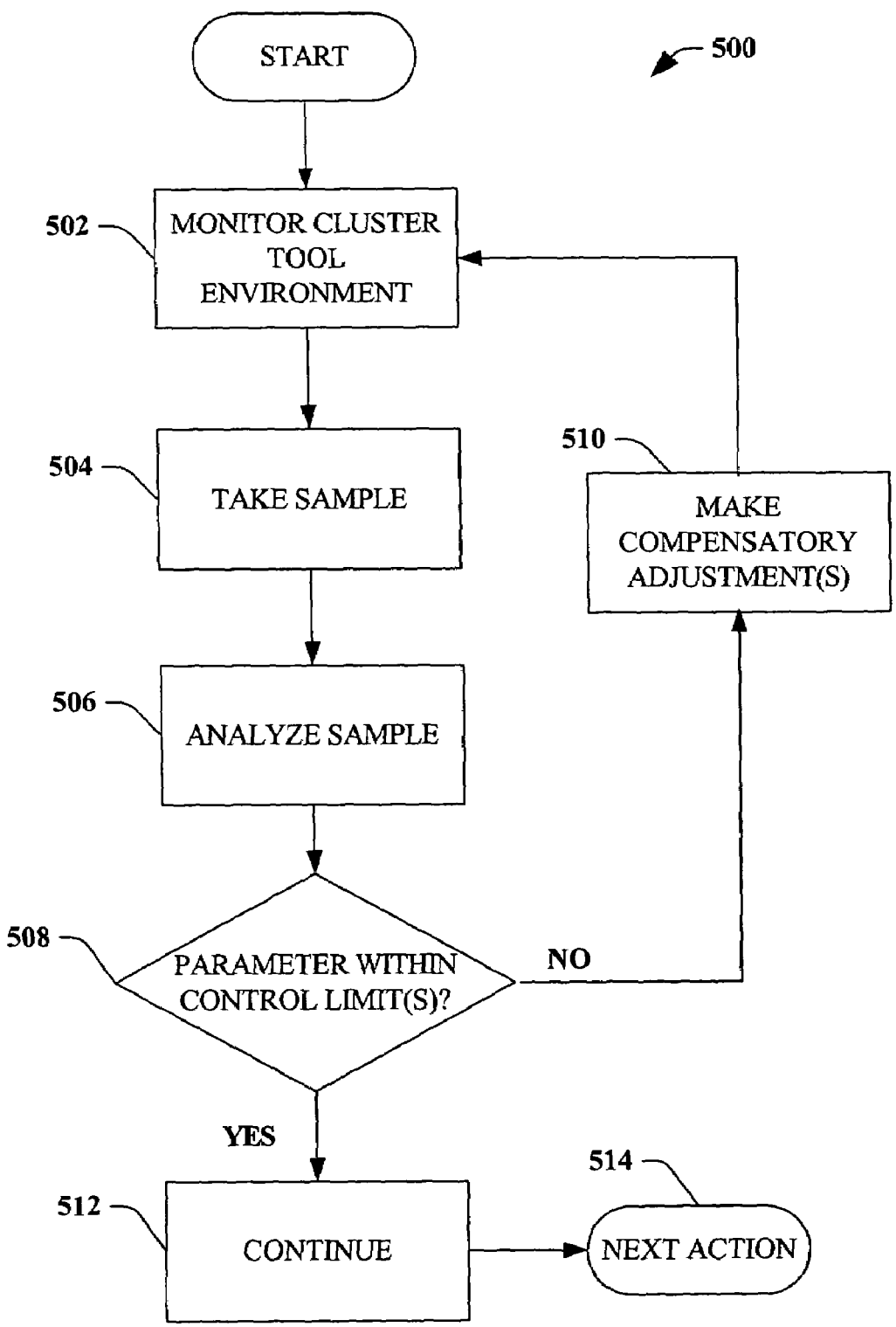
FIG. 5 is a flow diagram of a methodology that improves process controls in accordance with an aspect of the present invention.
Figure 6:
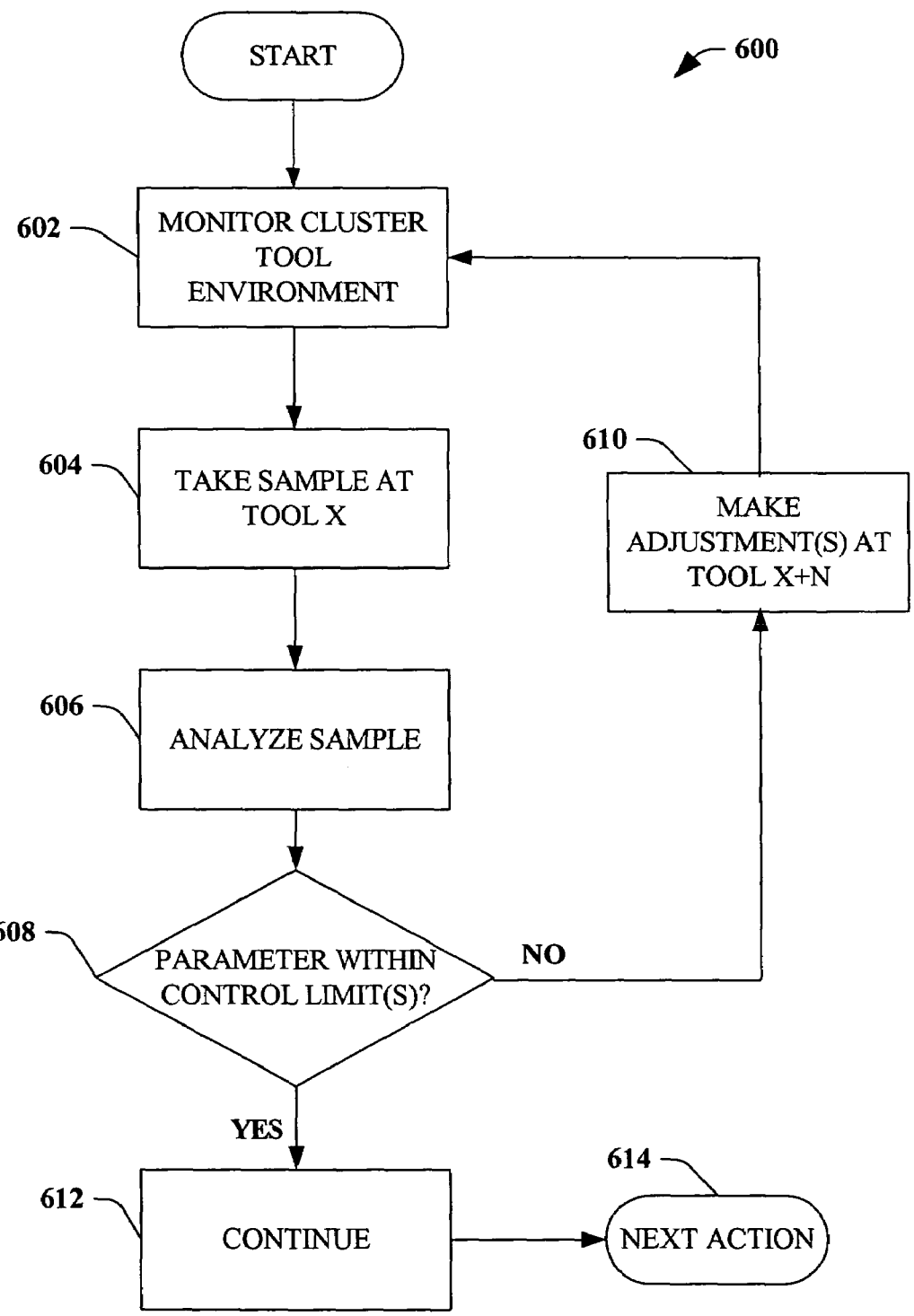
FIG. 6 is a flow diagram of a methodology that improves process controls in accordance with an aspect of the present invention.
Figure 7:
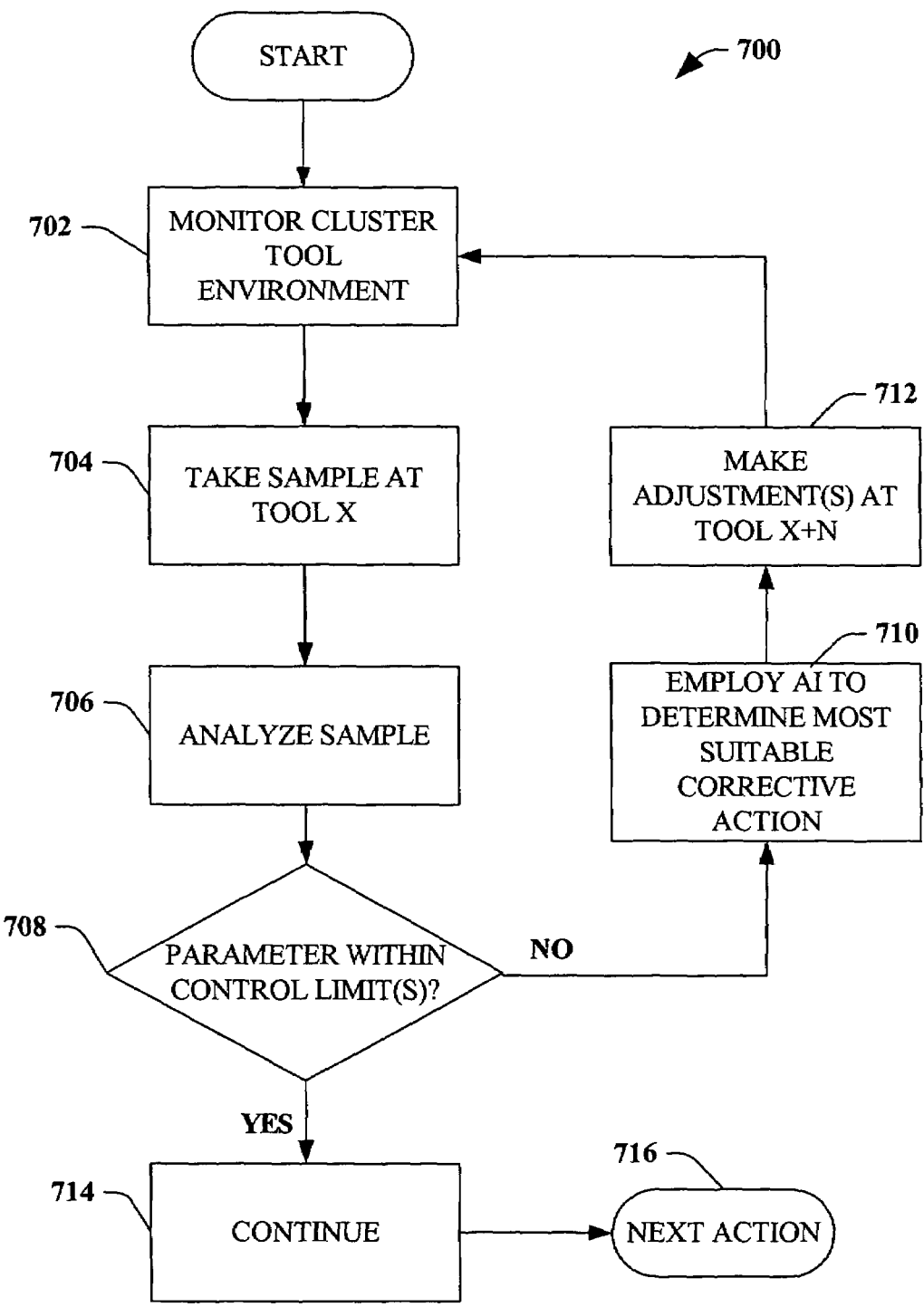
FIG. 7 is a flow diagram of a methodology that improves process controls in accordance with an aspect of the present invention.

FIGS. 5–7 illustrates various methodologies in accordance with the subject invention. While, for purposes of simplicity of explanation, the methodologies are shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

FIG. 5 illustrates a methodology in accordance with an aspect of the present invention. A cluster tool environment is monitored in-situ at 502. Monitoring of the cluster tool environment can be performed via a central OCD component that utilizes, for example, a scatterometry system. For example, in a lithography track, hot plate temperature, resist temperature, developer temperature, resist thickness, blank defect(s), etc. can be monitored in order to effectuate increased efficiency and cost reductions in wafer production. According to another example, a stepper can be monitored to ensure that exposure time, intensity, focus, etc. are within control. If a plasma etch tool is being monitored, descum time, PC, etch rate, profile, etc. can be conditions about which information is gleaned. According to still another example, particle count and etch rate in a cleaning tool can be monitored to detect any variances that might indicate an out-of-control occurrence. Additionally, a chemical bath, for example, can be monitored with respect to polymer concentration, desirability of filter replacement, etc. Monitoring of such tools and the conditions associated therewith are given by way of example only, and are not intended to limit the scope of the present invention.

At 504, a sample is taken of the information gleaned during monitoring of a wafer in the cluster tool environment. The sample is then analyzed for indications of an out-of-control state at 506. At 508, a determination is made regarding the presence of an out-of-control condition in any of the monitored conditions. If a condition is not within a pre-determined confidence level or tolerance, then adjustments are made to the tool exhibiting the out-of-control condition at 510 to compensate for the condition so that subsequent wafers will not be adversely affected. Such adjustment(s) can be based on predetermined algorithms for taking action when a specific set of criteria are present. Alternatively, adjustment(s) can be based on inferences made by the present invention in order to more effectively compensate for deviant condition parameters in real time. Once an adjustment has been made, the method reverts to 502 where monitoring continues. If, at 508, it is determined that monitored parameters are within desired tolerances, then the method proceeds to 512, where wafer production continues without any APC action. A subsequent action to be performed on the wafer can then occur at 514.

FIG. 6 illustrates a methodology 600 in accordance with an aspect of the present invention that compensates for an out-of-control condition at one tool by initiating adjustments of parameters in a subsequent tool in a cluster tool environment. At 602, the cluster tool environment is monitored in-situ using, for example, scatterometry. At 604, a sample of conditions and/or parameters associated with production of a wafer is taken at $TOOL_X$. For example, $TOOL_X$ can be a stepper, a plasma etcher, or any tool in the cluster tool environment. At 606, the sampled information is analyzed and compared to predetermined condition parameters. At 608, a determination is made regarding whether conditions at $TOOL_X$ are within desired tolerances. If a condition associated with $TOOL_X$ is determined to be out of control, then the method advances to 610, where adjustments are made to the operating parameters of a subsequent tool, $TOOL_{X+N}$, in the cluster tool environment to compensate for the effect(s) of the undesired condition detected at $TOOL_X$. For instance, if a duration of wafer exposure at a stepper tool is too long, such that the solubility of exposed portions of the wafer is not within target tolerances, then the etch rate at subsequent plasma etch tool can be adjusted to compensate for the deviant solubility of the exposed portions of the wafer. The method then reverts to 602 and continues monitoring the cluster tool environment.

If sampled information indicates that conditions at a given tool are within control limits, then at 612 fabrication continues. At 614, a subsequent lithographic action can be performed on the wafer. For example, if the methodology is performed on a cluster tool environment while a wafer is on a lithographic track, and no parameters are determined to be out of control, then the subsequent action at 614 can be performed by a stepper.

FIG. 7 illustrates a methodology 700 in accordance with an aspect of the invention that employs artificial intelligence (AI) to infer a most suitable compensatory action for correcting an out-of-control occurrence. A cluster tool environment is monitored using, for example, scatterometry, at 702. At 704, a sample of information gathered during monitoring of the cluster tool environment is taken. The sampled data is analyzed at 706 to ensure that fabrication parameters are within desired tolerances. At 708, a determination is made as to whether any out-of-control occurrences are present in the cluster tool environment. If an operating parameter is determined to be out of control at 708, then AI is employed at 710 to infer a most suitable adjustment to facilitate correcting any deleterious effects the out-of-control condition caused on the wafer. For example, an undesirably high temperature condition on a bake plate can result in wafer CD outside a target tolerance. AI can be employed to infer whether, for instance, adjusting an etch rate, an exposure period, a chemical bath concentration, etc., will best compensate for the undesired CD variation. At 712, adjustments can be made to a subsequent tool in the cluster tool environment so that the action of the subsequent tool can compensate for the undesired effect of the tool exhibiting an out-of-control parameter. If all monitored parameters are within control limits, then fabrication continues at 714. At 716, a subsequent lithographic action can be performed on the wafer.

Turning now to FIGS. 8–10, in accordance with one or more aspects of the present invention, a wafer 802 (or one or more die located thereon) situated on a stage 804 can be logically partitioned into grid blocks to facilitate concurrent measurements of critical dimensions and overlay as the wafer matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the wafer 802. The wafer 802 can be divided into a grid pattern as shown in FIG. 8. Each grid block (XY) of the grid pattern corresponds to a particular portion of the wafer 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 9, one or more respective portions of the wafer 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 802 and or one or more die located thereon can be mapped into any suitable number and/or arrangement of grid blocks to effectuate desired monitoring and control.

FIG. 10 is a representative table of concurrently measured critical dimensions and overlay taken at various portions of the wafer 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the wafer 802 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 802 as desired. For example, when the fabrication process has reached a pre-determined threshold level (e.g., X % of grid blocks have acceptable CDs and no overlay error exists), a fabrication step can be terminated.

Figure 11:
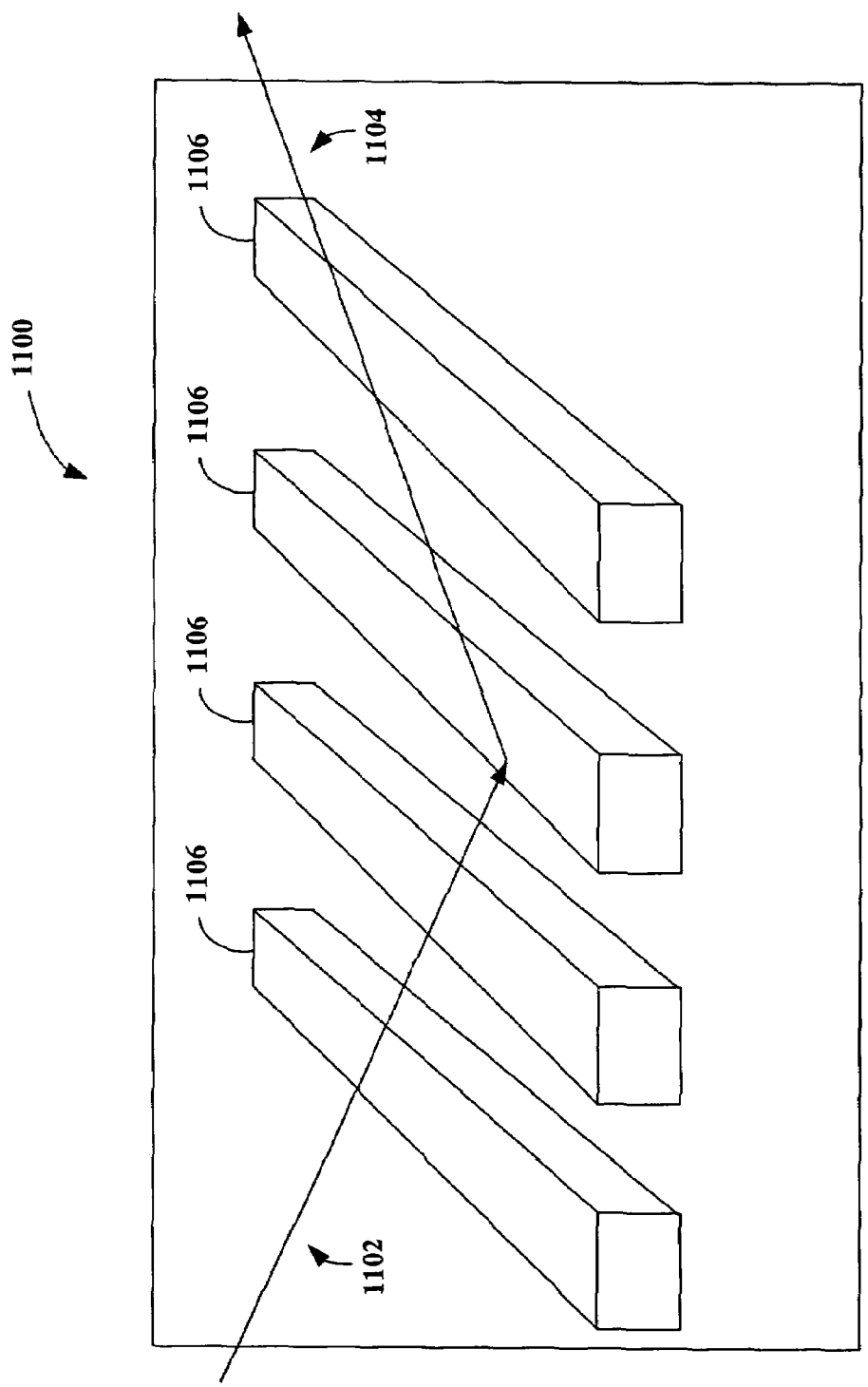
FIG. 11 is a simplified perspective view of an incident light reflecting off a surface in accordance with one or more aspects of the present invention.
Figure 12:
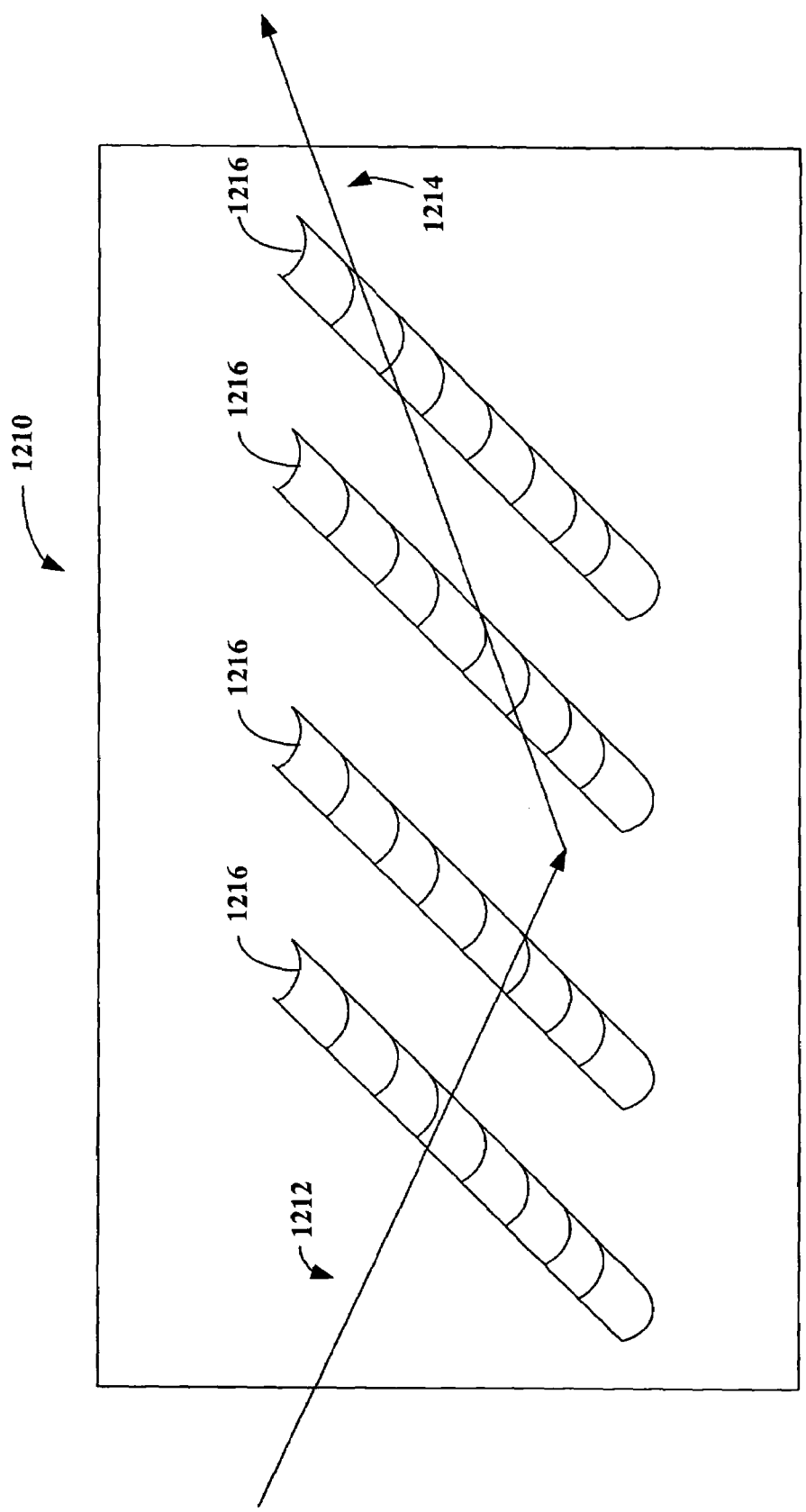
FIG. 12 is a simplified perspective view of an incident light reflecting off a surface in accordance with one or more aspects of the present invention.

To illustrate the principles described above, and to detail the advantages of employing scatterometry techniques in conjunction with aspects of the present invention, reference is now made to FIGS. 11 and 12. Referring initially to FIG. 11, an incident light 1102 is directed at a surface 1100, upon which one or more features 1106 may exist. In FIG. 11 the incident light 1102 is reflected as reflected light 1104. The incident light 1102 and/or reflected light 1104 can propagate through an immersion medium (not shown). The properties of the surface 1100, including but not limited to, thickness, uniformity, planarity, chemical composition and the presence of features, can affect the reflected light 1104. In FIG. 11, the features 1106 are raised upon the surface 1100. The phase of the reflected light 1104 can be plotted, as can the intensity of the reflected light 1104. Such plots can be employed in connection with known grating structures built upon the surface to compare measured signals with signatures stored in a signature library in a memory using techniques such as pattern matching, for example.

Referring now to FIG. 12, incident light 1212 is directed onto a surface 1210 upon which one or more depressions 1216 appear. The incident light 1212 is reflected as reflected light 1214. Like the one or more features 1106 (FIG. 11) may affect an incident beam, so too may the one or more depressions 1216 affect an incident beam. Thus, it is to be appreciated that scatterometry can be employed to measure features appearing on a surface, features appearing in a surface, and properties of a surface itself, regardless of features.

Figure 13:
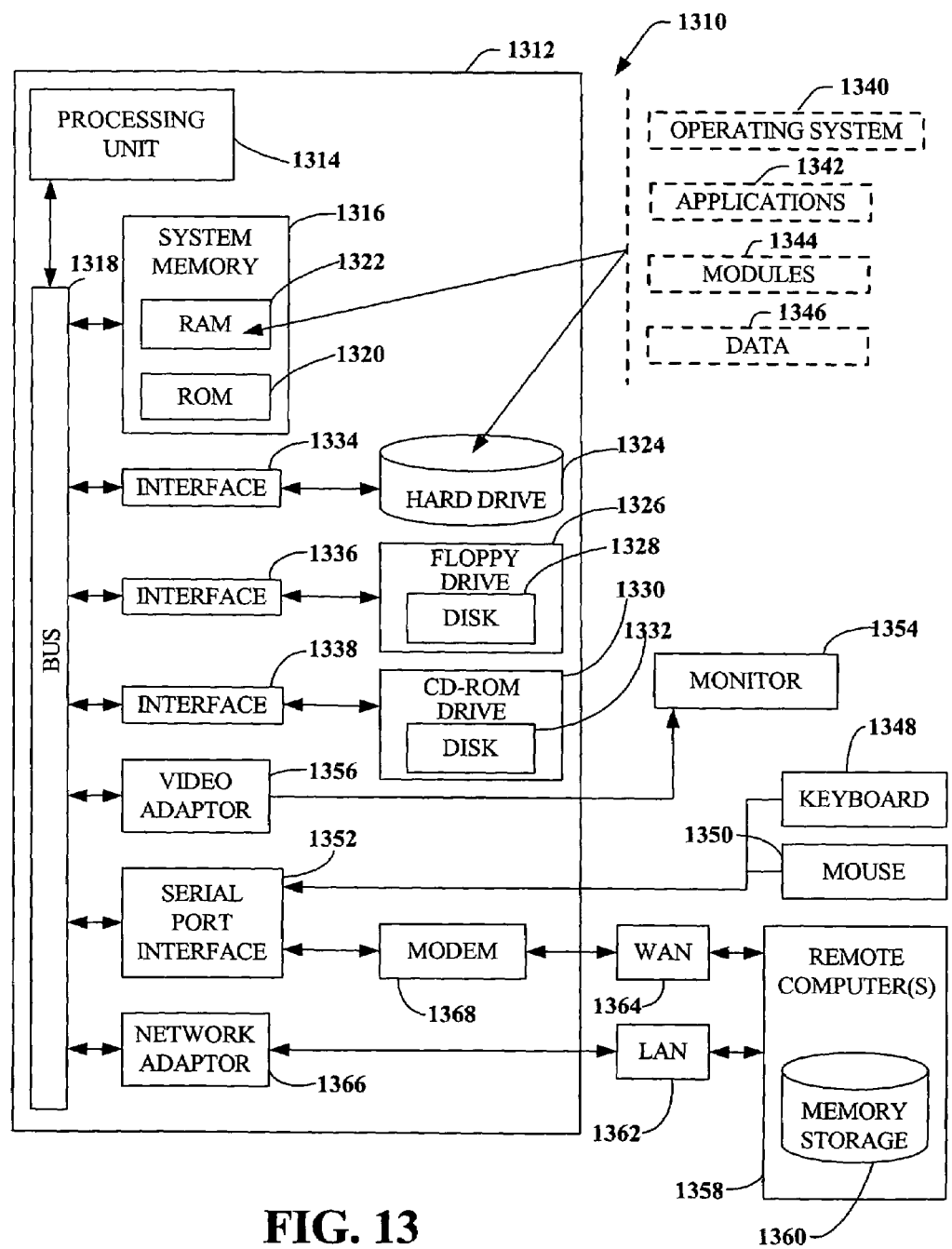
FIGS. 13 and 14 illustrate exemplary computing systems and/or environments in connection with facilitating employment of the subject invention.
Figure 14:
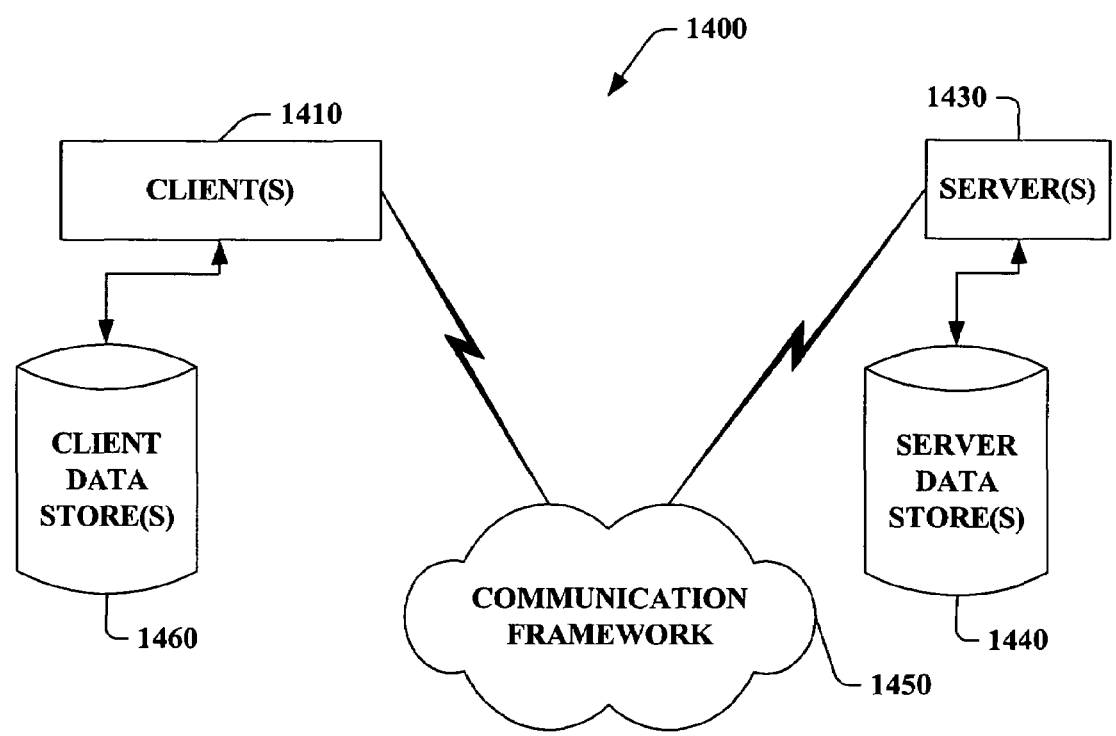

In order to provide a context for the various aspects of the invention, FIGS. 13 and 14 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 13, an exemplary environment 1310 for implementing various aspects of the invention includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus utilizing any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1316 includes volatile memory 1320 and nonvolatile memory 1322. The basic input/output system (BIOS), comprising the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable ROM (EEPROM), or flash memory. Volatile memory 1320 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1312 also includes removable/non-removable, volatile/non-volatile computer storage media. FIG. 13 illustrates, for example a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to the system bus 1318, a removable or non-removable interface is typically used such as interface 1326.

It is to be appreciated that FIG. 13 describes software that acts as an intermediary between users and the basic computer resources described in suitable operating environment 1310. Such software includes an operating system 1328. Operating system 1328, which can be stored on disk storage 1324, acts to control and allocate resources of the computer system 1312. System applications 1330 take advantage of the management of resources by operating system 1328 through program modules 1332 and program data 1334 stored either in system memory 1316 or on disk storage 1324. It is to be appreciated that the present invention can be implemented with various operating systems or combinations of operating systems.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment utilizing logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

FIG. 14 is a schematic block diagram of a sample-computing environment 1400 with which the present invention can interact. The system 1400 includes one or more client(s) 1410. The client(s) 1410 can be hardware and/or software (e.g., threads, processes, computing devices). The system 1400 also includes one or more server(s) 1430. The server(s) 1430 can also be hardware and/or software (e.g., threads, processes, computing devices). The servers 1430 can house threads to perform transformations by employing the present invention, for example. One possible communication between a client 1410 and a server 1430 can be in the form of a data packet adapted to be transmitted between two or more computer processes. The system 1400 includes a communication framework 1450 that can be employed to facilitate communications between the client(s) 1410 and the server(s) 1430. The client(s) 1410 are operably connected to one or more client data store(s) 1460 that can be employed to store information local to the client(s) 1410. Similarly, the server(s) 1430 are operably connected to one or more server data store(s) 1440 that can be employed to store information local to the servers 1430.

What has been described above includes examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that improves advanced process control in a semiconductor manufacturing environment, comprising:
   a cluster tool environment that manufactures a wafer; and
   a monitoring component that monitors conditions in the cluster tool environment and scans the wafer in situ;
   a control component that processes information associated with measured parameters of the wafer and/or the cluster tool environment.

2. The system of claim 1, wherein the monitoring component is an optical scatterometry component.

3. The system of claim 1, wherein the control component further comprises a sampling component, an analyzing component, and an adjusting component.

4. The system of claim 1, wherein the cluster tool environment comprises at least one of a lithographic track system, a stepper, a plasma etcher, a cleaning tool, and a chemical bath.

5. The system of claim 1, further comprising a memory that stores information related to measured parameters of the wafer and/or the cluster tool environment.

6. The system of claim 5, wherein the memory comprises at least one of volatile memory and nonvolatile memory.

7. The system of claim 1, further comprising an artificial intelligence component that makes inferences regarding manufacture of the wafer.

8. The system of claim 7, wherein the artificial intelligence component is at least one of a support vector machine, a neural network, an expert system, a Bayesian belief network, fuzzy logic, and a data fusion engine.

9. The system of claim 1, wherein monitoring component scans the wafer continuously during fabrication.

10. The system of claim 1, wherein the control component continuously receives information from the cluster tool environment related to conditions in the cluster tool environment.

11. A method that improves advance process control in a semiconductor manufacturing environment, comprising:
   continuously monitoring in situ a cluster tool environment and a wafer therein;
   sampling data acquired during monitoring of the wafer and cluster tool environment;
   analyzing the data sample(s); and
   determining whether measured parameters of the wafer and/or cluster tool environment are within control limits.

12. The method of claim 11, further comprising continuing fabrication of a wafer if measured parameters are within control limits.

13. The method of claim 11, further comprising making compensatory adjustment(s) if a measured parameter is out of control.

14. The method of claim 13, further comprising sampling and analyzing monitored parameter data at a specific tool, $TOOL_X$, in the cluster tool environment to determine whether a parameter is out of control, where X denotes the position of the tool in a sequence of fabrication tools in the cluster tool environment.

15. The method of claim 14, further comprising making compensatory adjustment(s) to parameter(s) of a subsequent tool, $TOOL_{X+N}$, if an out-of-control parameter is present at $TOOL_X$, where N denotes the position of the adjusted tool relative to $TOOL_X$ in the cluster tool environment.

16. The method of claim 15, further comprising making inferences regarding most suitable compensatory adjustment(s).

17. The method of claim 14, further comprising making compensatory adjustments to $TOOL_X$ to prevent further out-of-control occurrences in subsequent wafers.

18. The method of claim 11, further comprising making compensatory adjustments to correct an out-of-control parameter detected on the wafer.

19. The method of claim 18, further comprising making inferences regarding most suitable parameter adjustment(s) based at least in part on the out-of-control parameter detected on the wafer.

20. The method of claim 11, further comprising employing optical scatterometry to monitor the cluster tool environment and/or the wafer.

21. The method of claim 11, further comprising employing feedback and/or feed-forward loop(s) to facilitate a determination of whether to initiate corrective action or continue prescribed fabrication.

22. A method of providing improved process control in semiconductor manufacture, comprising:
   means for monitoring at least one of a wafer and a cluster tool environment in situ;
   means for analyzing information germane to the monitored wafer and/or cluster tool environment;
   means for determining whether monitored parameters are with control limits; and
   means for taking compensatory action to correct an out-of control condition, detected.

23. The method of claim 22, further comprising means for inferring a most suitable compensatory action.

24. The method of claim 22, further comprising means for receiving feedback and/or feed-forward information from the cluster tool environment to facilitate taking compensatory action.

* * * * *